(12) United States Patent
Li et al.

(10) Patent No.: US 8,570,754 B2
(45) Date of Patent: Oct. 29, 2013

(54) SERVER ASSEMBLY WITH REMOVABLE SERVER MODULE

(75) Inventors: Xiao-Zheng Li, Shenzhen (CN); Wen-Tang Peng, New Taipei (TW)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 58 days.

(21) Appl. No.: 13/455,146

(22) Filed: Apr. 25, 2012

(65) Prior Publication Data

US 2013/0258587 A1  Oct. 3, 2013

(30) Foreign Application Priority Data

Apr. 3, 2012  (CN) .......................... 2012 1 0095721

(51) Int. Cl.
*H05K 5/00* (2006.01)
*H05K 7/00* (2006.01)
*G06F 1/16* (2006.01)

(52) U.S. Cl.
USPC ........... 361/727; 361/724; 361/725; 361/726; 361/679.39

(58) Field of Classification Search
USPC ................. 361/679.39, 724, 725, 726, 727; 312/223.1, 223.2
See application file for complete search history.

(56) References Cited

U.S. PATENT DOCUMENTS

| 5,233,594 A * | 8/1993 | Wilhelm ................... 361/679.37 |
| 6,481,809 B1 * | 11/2002 | Richardson ................ 312/223.2 |
| 7,576,978 B2 * | 8/2009 | Fan et al. ................. 361/679.37 |
| 7,583,507 B2 * | 9/2009 | Starr et al. ..................... 361/727 |
| 7,859,834 B2 * | 12/2010 | Fukuda et al. ........... 361/679.46 |
| 7,881,062 B2 * | 2/2011 | Chen et al. ..................... 361/725 |
| 8,373,983 B2 * | 2/2013 | Zhang ..................... 361/679.33 |
| 8,493,718 B2 * | 7/2013 | Zhang ..................... 361/679.02 |
| 2005/0111178 A1 * | 5/2005 | Bradley et al. ................ 361/684 |
| 2008/0117587 A1 * | 5/2008 | Fan et al. ....................... 361/685 |

* cited by examiner

*Primary Examiner* — Anthony Haughton
(74) *Attorney, Agent, or Firm* — Altis & Wispro Law Group, Inc.

(57) ABSTRACT

A server assembly includes a chassis and a server module slidably received in the chassis. The chassis includes a backplane with a connector. The server module includes a mounting plate and a connecting plate movably attached to the mounting plate. A plurality of supporting posts protrude on the mounting plate. The connecting plate defines a plurality of elongated through slots according to the supporting posts. A flexible member is locked in each through slot. A plurality of fasteners extend through the flexible members to screw into the supporting posts, respectively. A resilient resisting member is arranged on the mounting plate, to abut against a front end of the connecting plate to insert a rear end of the connecting plate in the connector.

17 Claims, 5 Drawing Sheets

SERVER ASSEMBLY WITH REMOVABLE SERVER MODULE

BACKGROUND

1. Technical Field

The present disclosure relates to a server assembly with removable server modules.

2. Description of Related Art

A server assembly includes a chassis and at least one removable server module slidably mounted in the chassis. Because connecting portions of the server module and connectors on a backplane of the chassis cannot be seen, the connectors of the server module may not properly align with and mate with the corresponding connecting portions, which may damage the connectors and the connecting portions.

BRIEF DESCRIPTION OF THE DRAWINGS

Many aspects of the present embodiments can be better understood with reference to the drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

The disclosure, including the accompanying drawings, is illustrated by way of examples and not by way of limitation. It should be noted that references to "an" or "one" embodiment in this disclosure are not necessarily to the same embodiment, and such references mean at least one.

Figure 1:
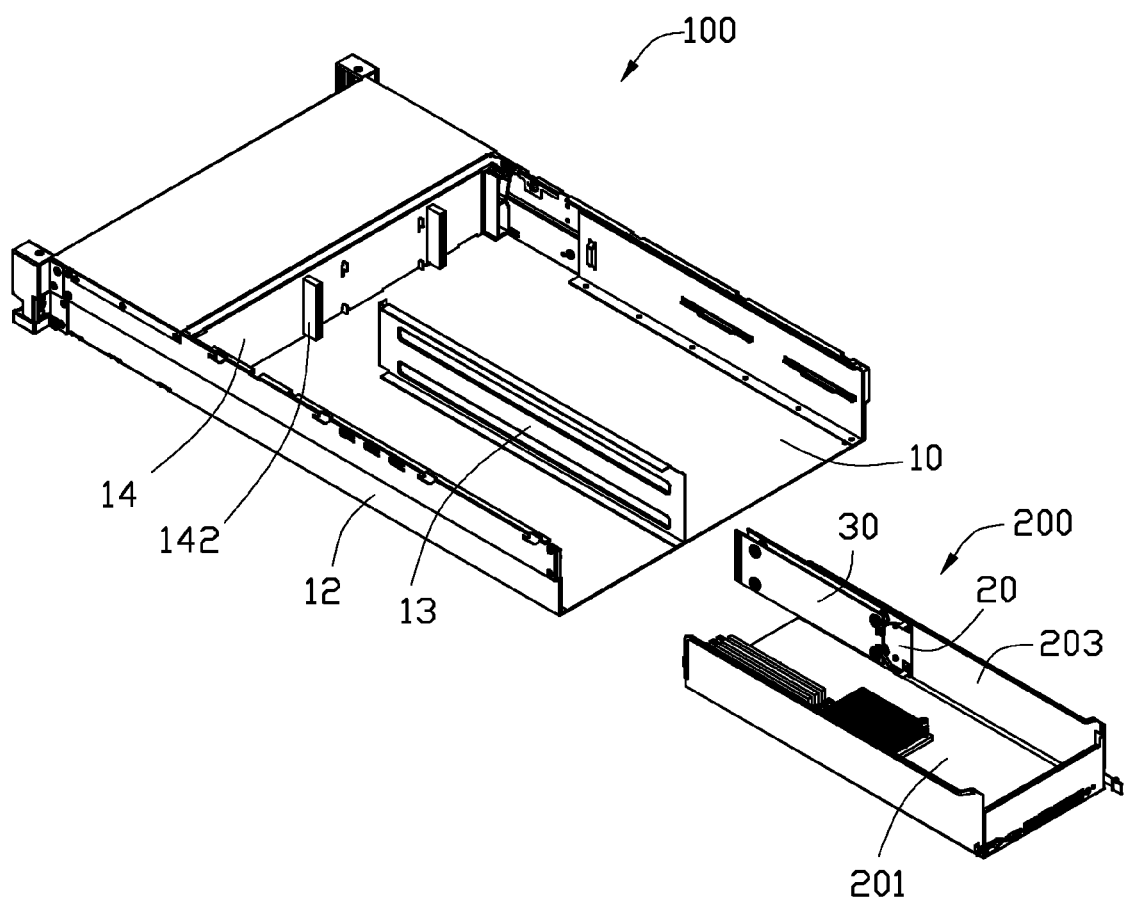
FIG. 1 is an exploded, isometric view of an embodiment of a server assembly, wherein the server assembly includes a chassis and a server module, the server module includes a connecting plate and a mounting plate.

FIG. 1, is an embodiment of a server assembly including a chassis 100 and a removable server module 200 mounted in the chassis 100.

The chassis 100 includes a bottom wall 10 and two sidewalls 20 perpendicularly extending from opposite sides of the bottom wall 10. A dividing plate 13 is uprightly set on the bottom wall 10 between the sidewalls 20 and parallel to the sidewalls 20. The dividing plate 13 and one of the sidewalls 20 cooperatively form a receiving space for receiving the server module 200. A backplane 14 is perpendicularly fixed on a rear end of the bottom wall 10. A connector 142 is set on the backplane 14 between the dividing plate 13 and the one of the sidewalls 20.

The server module 200 includes a bottom plate 201, two side plates 203 perpendicularly extending from opposite sides of the bottom wall 10, a mounting plate 20 fixed on an inner side of one of the side plates 203 near a rear end of the server module 200, and a connecting plate 30 mounted to the mounting plate 20. A plurality of function units, such as central processing units, is set on the bottom plate 201.

Figure 2:
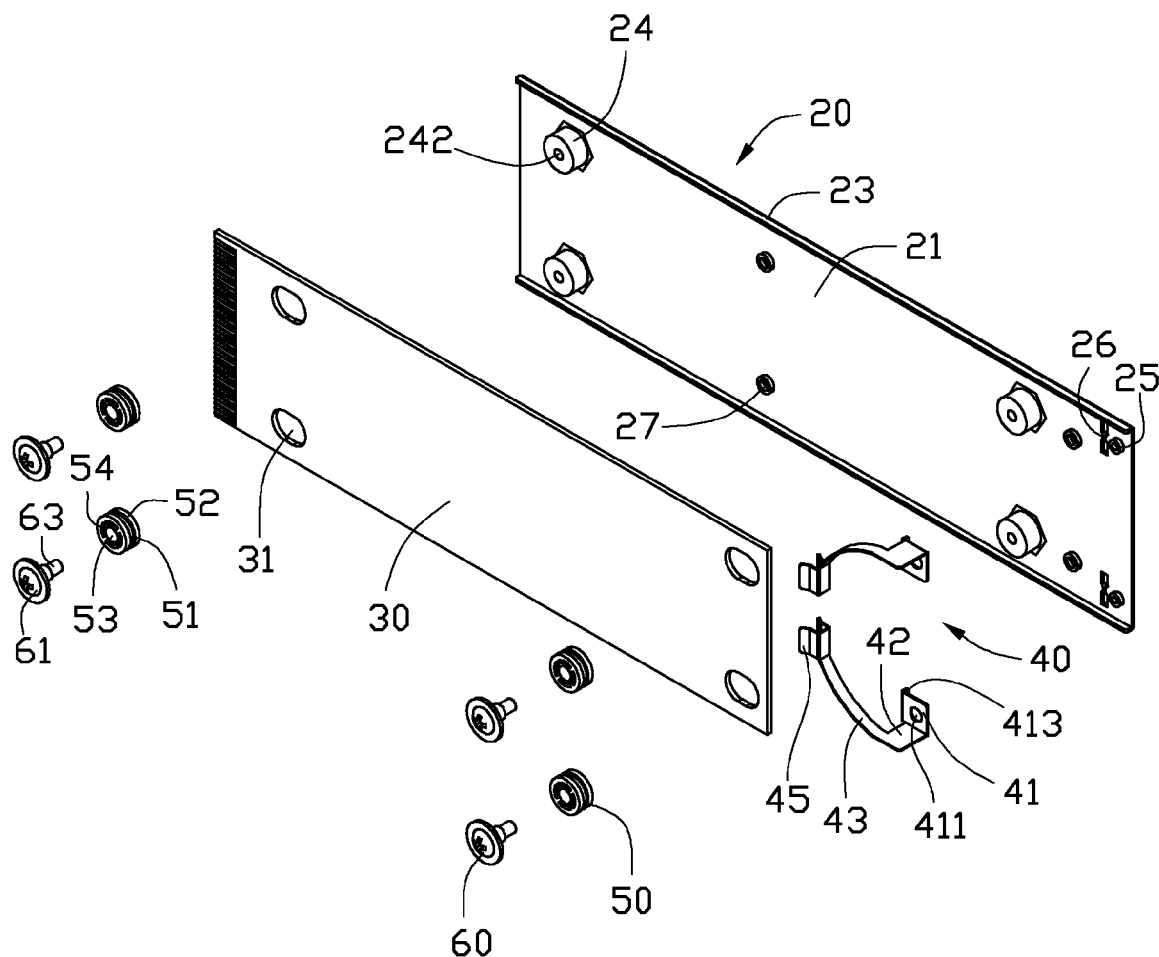
FIG. 2 is an exploded, isometric view of the connecting plate and the mounting plate of FIG. 1.

FIG. 2, shows the mounting plate 20 including a main plate 21 and two flanges 23 extending inward from opposite sides of the main plate 21 for reinforcing the main plate 21. Four supporting posts 24 protrude on an inner surface of the main plate 21. Each supporting post 24 defines a screw hole 242 along an axis. Two mounting rods 25 respectively protrude on the inner surface of the main plate 21, at a front end of the main plate 21 and near the flanges 23. Two upright positioning slots 26 are respectively defined in the main plate 21 near inner sides of the mounting rods 25. The main plate 21 defines a plurality of fixing holes 27, for fixing the main plate 21 on the side plate 203 with screws or bolts.

The connecting plate 30 defines four elongated through slots 31 along a front-to-rear direction. The diameter of each supporting post 24 is larger than the size of the through slots 31 along a width direction. A plurality of connecting portions, such as golden fingers (not labeled), are set on a rear end of the connecting plate 30, for electrical connection with the connector 142.

Figure 3:
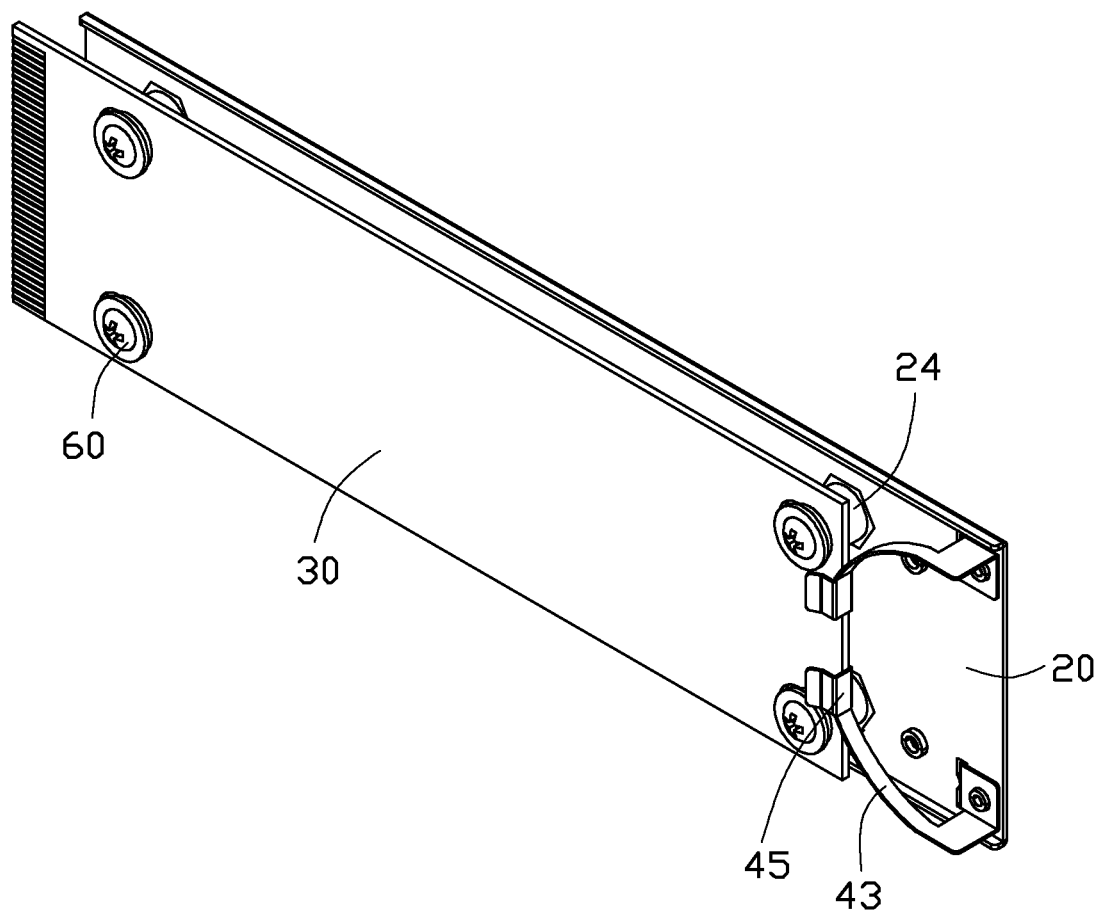
FIG. 3 is an assembled, isometric view of FIG. 2.

FIG. 3, shows the connecting plate 30 is resiliently attached to the mounting plate 20 via two resisting members 40, four flexible members 50, and four fasteners 60. Each resisting member 40 includes a mounting piece 41, a connecting piece 42 perpendicularly extending from one side of the mounting piece 41, a resilient and arc-shaped resisting piece 43 extending from a rear side of the connecting piece 42, and a U-shaped engaging piece 45 extending from a distal end of the resisting piece 43 opposite to the connecting piece 42. A through hole 411 is defined in a center of the mounting piece 41. An upright positioning tab 413 protrudes on a rear side of the mounting piece 41.

Each flexible member 50 is a column, and defines a ring shaped locking slot in a circumference of the column to form a neck portion 51 and two flange portions 52 formed at opposite ends of the neck portion 51. A through hole 53 is defined in the column along an axis of the column. Each flexible member 50 further defines four arc-shaped through apertures 54 around the through hole 53, to increase flexibility of the flexible member 50. The flexible members 50 are made of flexible material, such as rubber. Each fastener 60 includes a head 61 and a screw portion 63. The diameter of the head 61 is larger than the diameter of the through hole 53.

Figure 4:
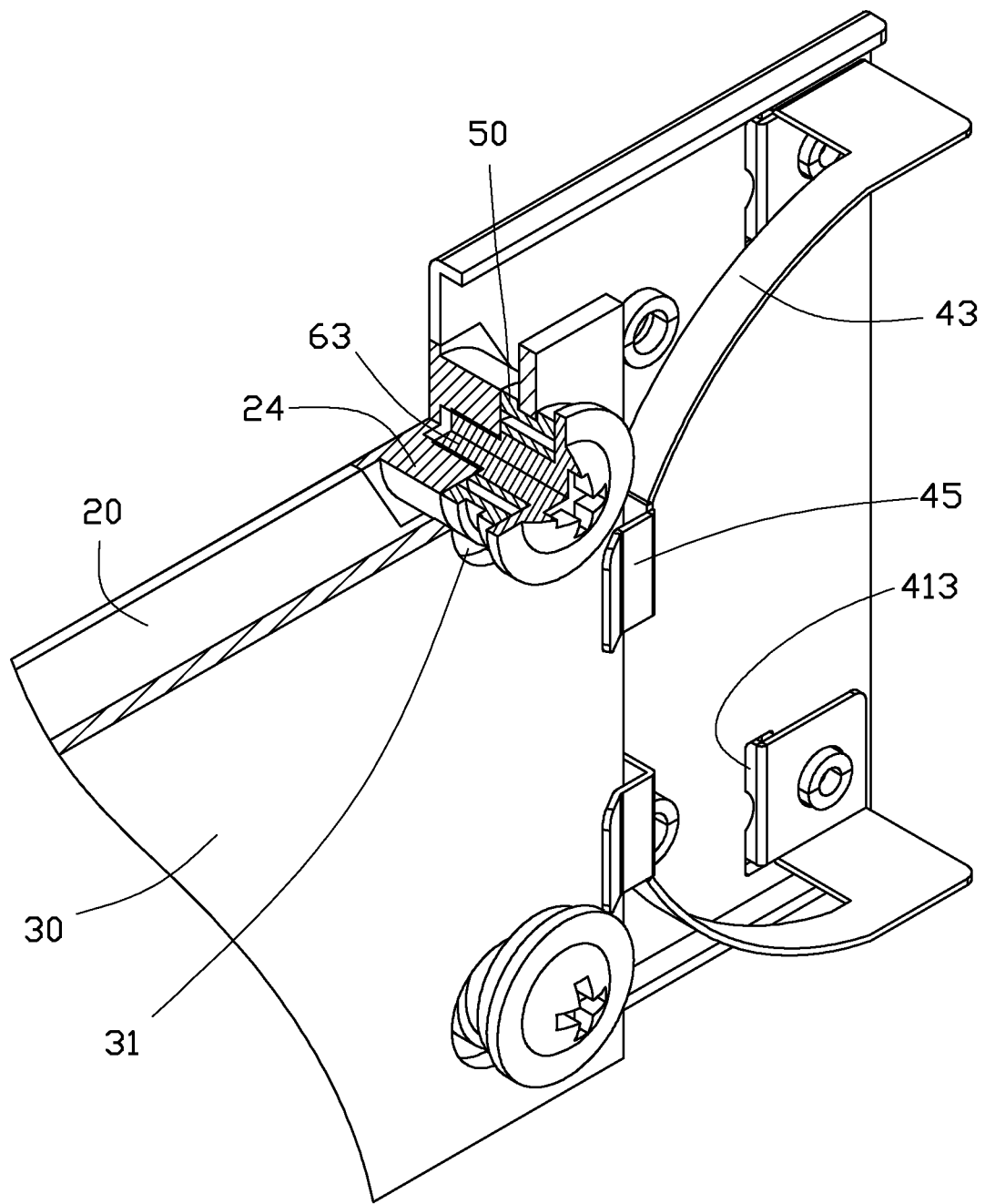
FIG. 4 is an enlarged, partially sectioned view of FIG. 3.

FIG. 3 and FIG. 4, show in assembling the connecting plate 30 to the mounting plate 20, the position tabs 413 are respectively inserted in the positioning slots 26. The mounting rods 25 respectively engage in the through holes 411, to fasten the mounting pieces 41 to the main body 21. The flexible members 50 are respectively pressed to be deformed to engage in the through slots 31. The screw portions 63 of fasteners 60 extend through the through holes 53 to respectively screw into the screw holes 242. The head 61 is blocked by the corresponding flexible member 50. The flange portions 52 of each flexible member 50 are blocked by two opposite side surfaces of the connecting plate 30. Therefore the connecting plate 30 is supported on the supporting posts 24. The engaging pieces 45 clamps a front end of the connecting plate 30. The resisting pieces 43 are deformed to push the connecting plate 30 rearward.

Figure 5:
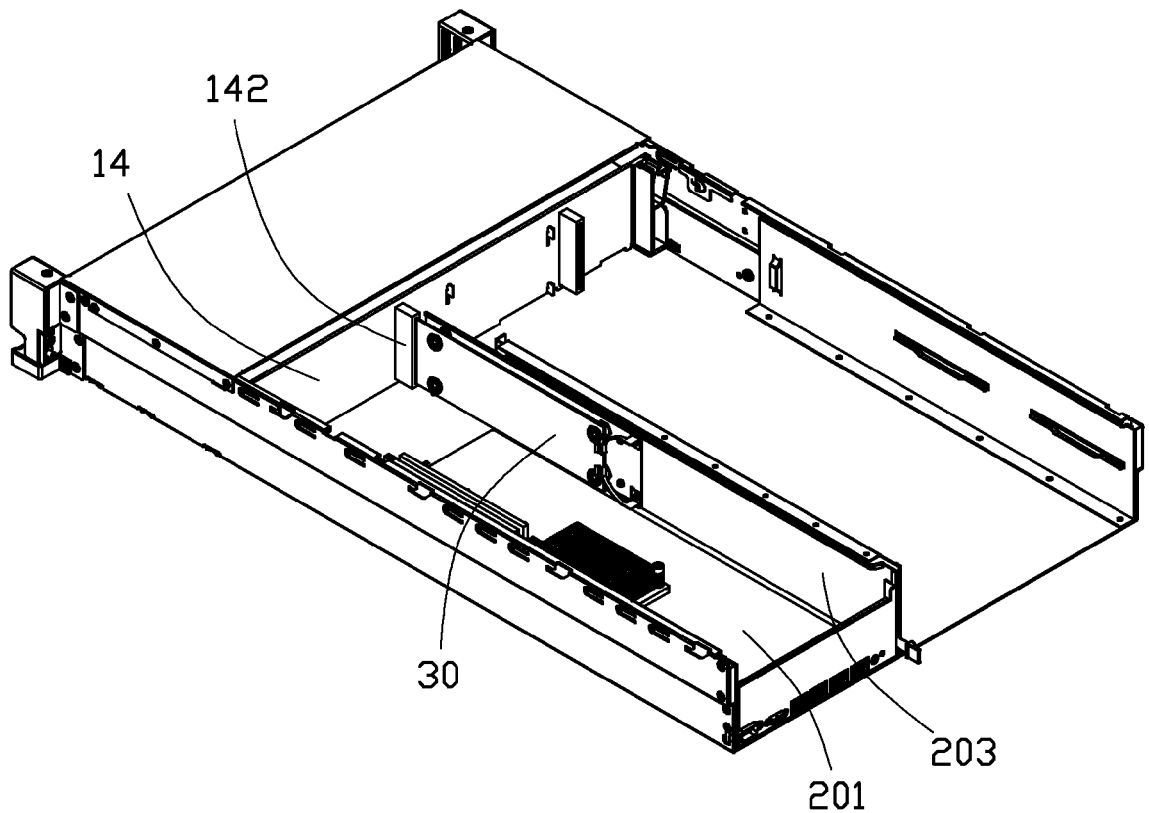
FIG. 5 is an assembled, isometric view of FIG. 1.

FIG. 5, shows in assembling the server module 200, is slid into the receiving space of the chassis 100, with the rear end aligning with the backplane 14, until the golden fingers of the connecting plate 30 are plugged into the connector 142.

In this embodiment, the resisting members 40 resiliently resist against the connecting plate 30 rearward, which can counteract the front-to-rear direction tolerance to prevent the connecting plate 30 from releasing from the backplane 14 in the front-to-rear direction. The neck portions 51 of the flexible members 50 engaging with edges of through slots 31 can counteract the up-to-down direction tolerance to prevent the connecting plate 30 from loosing in the up-to-down direction; the flange portions 52 of the flexible members 50 engaging with the side surfaces of the connecting plate 30 can counteract the left-to-right direction tolerance to prevent the connecting plate 30 from loosening in the left-to-right direction. In addition, ensuring that the golden fingers of the connecting plate 30 are movable to properly align with the connector 142, which can decrease damage to the connector 44 and the connecting plate 30 during the insertion of the server module 200 into the chassis 100.

It is to be understood, however, that even though numerous characteristics and advantages of the embodiments have been set forth in the foregoing description, together with details of the structure and function of the embodiments, the disclosure is illustrative only, and changes may be made in detail, especially in the matters of shape, size, and arrangement of parts within the principles of the disclosure to the full extent indicated by the broad general meaning of the terms in which the appended claims are expressed.

What is claimed is:

1. A server module, comprising:
  a side plate;
  a mounting plate fixed on a rear end of the side plate, the mounting plate comprising a plurality of supporting posts protruding on the mounting plate and a resisting member fixed to a front end of the mounting plate; and
  a connecting plate for being electrically connected to a connector on a chassis to which the server module is attached, the connecting plate defining a plurality of elongated through slots each having a flexible member attached thereto, wherein each flexible member is movable relative to the corresponding elongated through slot and defines a through hole along an axis of the flexible member, a plurality of fasteners extends through the through holes of the flexible members to screw into the supporting posts, respectively, to movably mount the connecting plate to the mounting plate, the resisting member resiliently resists against a front end of the connecting plate such that the connecting plate is pushed to connect to the connector.

2. The server module of claim 1, wherein each flexible member is a column, and defines a ring shaped locking slot in a circumference of the column to form a neck portion and two flange portions formed at opposite ends of the neck portion, the flexible members are pressed to be deformed to extend through the through slots, respectively.

3. The server module of claim 2, wherein the flange portions of each flexible member define a plurality of arc-shaped through apertures around the through hole, to increase the flexibility of the flexible member.

4. The server module of claim 1, wherein each fastener comprises a head and a screw portion, the head is blocked by the corresponding flexible member, the screw portion extends through the through hole of the flexible member to screw into the corresponding supporting post.

5. The server module of claim 1, wherein the flexible members are made of flexible material.

6. The server module of claim 1, wherein the resisting member comprises a mounting piece fixed to the mounting plate, a connecting piece perpendicularly extending from one side of the mounting piece, a resilient and arc-shaped resisting piece extending from the connecting piece, and an engaging piece extending from a distal end of the resisting piece opposite to the connecting piece, the engaging piece resists against the front end of the connecting plate.

7. The server module of claim 6, wherein the engaging piece is U-shaped and clamps the front end of the connecting plate.

8. The server module of claim 6, wherein the mounting plate defines a positioning hole, a mounting rod protrudes on the mounting plate near the positioning hole, a through hole is defined in a center of the mounting piece, a positioning tab protrudes on a side of the mounting piece and engages in the positioning hole, the mounting rod engages in the through hole of the mounting piece to mount the resisting member to the mounting plate.

9. A server assembly, comprising:
  a chassis comprising a backplane fixed on a rear end of the chassis, a connector set on the backplane;
  a server module comprising:
    a side plate;
    a mounting plate fixed on a rear end of the side plate, the mounting plate comprising a plurality of supporting posts protruding on the mounting plate and a resisting member fixed to a front end of the mounting plate; and
  a connecting plate electrically connected with the connector, the connecting plate defining a plurality of elongated through slots each attaching a flexible member, wherein each flexible member is movable relative to the corresponding elongated through slot and defines a through hole along an axis of the flexible member, a plurality of fasteners extending through the through holes of the flexible member to screw into the supporting posts respectively, to movably mount the connecting plate to the mounting plate, the resisting member resiliently resists against a front end of the connecting plate to ensure connection portions located at a rear end of the connecting plate properly plugging in the connector.

10. The server module of claim 9, wherein each flexible member is a column, and defines a ring shaped locking slot in a circumference of the column to form a neck portion and two flange portions formed at opposite ends of the neck portion, the flexible members are pressed to be deformed to extend through the through slots, respectively.

11. The server module of claim 10, wherein the flange portions of each flexible member define a plurality of arc-shaped through apertures around the through hole, to increase the flexibility of the flexible member.

12. The server module of claim 9, wherein each fastener comprises a head and a screw portion, the head is blocked by the corresponding flexible member, the screw portion extends through the through hole of the flexible member to screw into the corresponding supporting post.

13. The server module of claim 9, wherein the flexible members are made of flexible material.

14. The server module of claim 9, wherein the resisting member comprises a mounting piece fixed to the mounting plate, a connecting piece perpendicularly extending from one side of the mounting piece, a resilient and arc-shaped resisting piece extending from the connecting piece, and an engaging piece extending from a distal end of the resisting piece opposite to the connecting piece, the engaging piece resists against the front end of the connecting plate.

15. The server module of claim 14, wherein the engaging piece is U-shaped and clamps the front end of the connecting plate.

16. The server module of claim 14, wherein the mounting plate defines a positioning hole, a mounting rod protrudes on the mounting plate near the positioning hole, a through hole is defined in a center of the mounting piece, a positioning tab protrudes on a side of the mounting piece and engages in the positioning hole, the mounting rod engages in the through hole of the mounting piece to mount the resisting member to the mounting plate.

17. The server module of claim 9, wherein the chassis comprises a bottom wall and two sidewalls perpendicularly extending from opposite sides of the bottom wall, a dividing plate is uprightly set on the bottom wall between the sidewalls and parallel to the sidewalls, the dividing plate and one of the sidewalls together form a receiving space for receiving the server module.

* * * * *